(12) United States Patent
Hasegawa et al.

(10) Patent No.: US 11,873,213 B2
(45) Date of Patent: Jan. 16, 2024

(54) ELECTROSTATIC-TYPE TRANSDUCER AND MANUFACTURING METHOD THEREOF

(71) Applicant: Sumitomo Riko Company Limited, Aichi (JP)

(72) Inventors: Koichi Hasegawa, Aichi (JP); Shinya Tahara, Aichi (JP); Katsuhiko Nakano, Aichi (JP); Masaaki Hamada, Aichi (JP); Masaki Nasu, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 926 days.

(21) Appl. No.: 16/867,534

(22) Filed: May 5, 2020

(65) Prior Publication Data
US 2020/0307992 A1 Oct. 1, 2020

Related U.S. Application Data

(63) Continuation of application No. PCT/JP2019/013633, filed on Mar. 28, 2019.

(51) Int. Cl.
*B81C 1/00* (2006.01)
*B06B 1/02* (2006.01)
*G01L 5/22* (2006.01)

(52) U.S. Cl.
CPC ........ *B81C 1/00182* (2013.01); *B06B 1/0292* (2013.01); *B81C 1/00166* (2013.01); *G01L 5/22* (2013.01)

(58) Field of Classification Search
CPC ... H04R 19/00; B06B 1/0292; B81C 1/00182; B81C 1/00166; H02N 1/08; H02N 1/006; G01L 5/22; G01L 1/146
See application file for complete search history.

(56) References Cited

U.S. PATENT DOCUMENTS

| 7,649,278 | B2 | 1/2010 | Yoshida et al. |
| 2007/0062753 | A1 | 3/2007 | Yoshida et al. |

(Continued)

FOREIGN PATENT DOCUMENTS

| CN | 101925793 | 12/2010 |
| CN | 110959295 | 4/2020 |

(Continued)

OTHER PUBLICATIONS

Office Action of China Counterpart Application, with English translation thereof, dated Aug. 4, 2021, pp. 1-23.

(Continued)

*Primary Examiner* — Tuan D Nguyen
(74) *Attorney, Agent, or Firm* — JCIPRNET

(57) ABSTRACT

An electrostatic-type transducer (1) includes: an insulator sheet (11) formed of an elastomer; a plurality of first electrode sheets (12, 13, 14) which is arranged on a front surface side of the insulator sheet (11), adhered to the insulator sheet (11) by fusion of the insulator sheet (11), and arranged with a distance from each other in the surface direction of the insulator sheet (11); and one second electrode sheet (15) which is disposed on the back surface side of the insulator sheet (11) and adhered to the insulator sheet (11) by fusion of the insulator sheet (11), and in which portions facing the plurality of first electrode sheets (12, 13, 14) and portions facing each region between the adjacent first electrode sheets (12, 13, 14) in the surface direction are formed integrally.

22 Claims, 4 Drawing Sheets

(56) References Cited

U.S. PATENT DOCUMENTS

| | | | |
|---|---|---|---|
| 2010/0288635 A1 | 11/2010 | Komiya et al. | |
| 2012/0006147 A1 | 1/2012 | Sano | |
| 2016/0173001 A1* | 6/2016 | Langa | B81B 3/0021 438/22 |
| 2018/0123481 A1* | 5/2018 | Zhi | H02N 99/00 |
| 2020/0053482 A1 | 2/2020 | Nakano et al. | |

FOREIGN PATENT DOCUMENTS

| | | |
|---|---|---|
| EP | 2154503 | 2/2010 |
| EP | 2239537 | 10/2010 |
| EP | 3573349 | 11/2019 |
| JP | 4814594 | 11/2011 |
| JP | 5360203 | 12/2013 |

OTHER PUBLICATIONS

"Search Report of Europe Counterpart Application", dated May 13, 2020, p. 1-p. 8.

* cited by examiner

ELECTROSTATIC-TYPE TRANSDUCER AND MANUFACTURING METHOD THEREOF

CROSS-REFERENCE TO RELATED APPLICATIONS

This application is a continuation application of International Application number PCT/JP2019/013633, filed on Mar. 28, 2019. The entirety of each of the above-mentioned patent applications is hereby incorporated by reference herein and made a part of this specification.

BACKGROUND OF THE DISCLOSURE

Technical Field

The disclosure relates to an electrostatic-type transducer and a manufacturing method thereof.

Related Art

In Japanese Patent No. 4814594, a plurality of force sensors embedded in a gripping portion of a steering wheel is disclosed. The plurality of force sensors is arranged independently in a peripheral direction of the ring-shaped gripping portion. Each force sensor includes, on a circular cross section of the gripping portion of the steering wheel, a core portion, a first conductor foil (electrode) pasted on the outer peripheral surface of the core portion, a resin portion disposed on the outer peripheral surface of the first conductor foil, a second conductor foil (electrode) disposed on the outer peripheral surface of the resin portion, and an outer cylindrical portion pasted on the outer peripheral surface of the second conductor foil.

In Japanese Patent No. 5360203, a structure of a seating surface electrode for detecting an electrocardiac signal respectively from the left and right of buttocks on a seating surface of a sheet is disclosed. The seating surface electrode includes one lower electrode disposed above a sheet member, an insulating layer disposed on an upper surface of the lower electrode, two independent upper electrodes disposed on an upper surface of the insulating layer, protective layers disposed on upper surfaces of the two upper electrodes, and electrically conductive portions disposed on inner peripheral surfaces of holes of the protective layers.

Each of the plurality of force sensors disclosed in Japanese Patent No. 4814594 includes the first electrode (conductor foil) and the second electrode (conductor foil) that are used as an electrode pair of an electrostatic-type sensor. For example, eight electrodes are required when four force sensors are arranged. Furthermore, the number of required wirings corresponds to the number of the electrodes. Accordingly, the larger the number of electrodes is, the larger the number of the wirings is, and there is room for improvement from the viewpoint of parts count and design flexibility.

Furthermore, in the electrostatic-type sensor, one of the electrode pair may be used as a reference potential. However, when a plurality of electrode pairs is all independent as disclosed in Japanese Patent No. 4814594, there is a risk of generating variations in the reference potential. In this case, the detection precision as a sensor may be reduced. In addition, one of the electrode pair may also be used as a reference potential even when the electrode pairs are applied as an electrostatic-type actuator. In this case, when variations are generated in the reference potential in a plurality of electrostatic-type actuators, the operation precision as an electrostatic-type actuator may be reduced.

In addition, in the seating surface electrode disclosed in Japanese Patent No. 5360203, the lower electrode is common while there are plural upper electrodes. Accordingly, it is preferable from the viewpoint of parts count, design flexibility, and suppression of variations in reference potential.

In addition, in recent years, as an environmental countermeasure, suppression of emission of volatile organic compounds (VOC) is required. Therefore, it is required that no volatile adhesives and no organic solvents are used. Accordingly, in the electrostatic-type sensor or the electrostatic-type actuator, it is also required that volatile adhesives or organic solvents are not used even in joining between the electrodes and other components.

Furthermore, in a transducer (senor or actuator) using capacitance between electrodes, it is known that the capacitance is different depending on the material of dielectric layer. When volatile adhesives or organic solvents are used, these components may have an effect on the capacitance. Furthermore, the volatile adhesives or the organic solvents may have an effect on the material of dielectric layer, and thus have an effect on the capacitance. As a result, there is a risk that the capacitance as designed cannot be obtained due to the effect of the volatile adhesives or the organic solvents.

SUMMARY

The disclosure provides an electrostatic-type transducer which functions in a plurality of places while reducing parts count and can be manufactured without using volatile adhesives and organic solvents, and provide a manufacturing method thereof.

The electrostatic-type transducer of the disclosure includes: an insulator sheet formed of an elastomer; a plurality of first electrode sheets which is arranged on a front surface side of the insulator sheet, adhered to the insulator sheet by fusion of the insulator sheet, and arranged with a distance from each other in the surface direction of the insulator sheet; and one second electrode sheet which is disposed on a back surface side of the insulator sheet and adhered to the insulator sheet by fusion of the insulator sheet, and in which portions facing the plurality of first electrode sheets and portions facing each region between the adjacent first electrode sheets in the surface direction are formed integrally.

In addition, in the manufacturing method of electrostatic-type transducer of the present invention, the plurality of first electrode sheets is arranged on the front surface side of the insulator sheet, and the plurality of first electrode sheets is adhered to the insulator sheet by the fusion of the insulator sheet by heating and pressing.

DESCRIPTION OF THE EMBODIMENTS

1. Application Target

Figure 1:
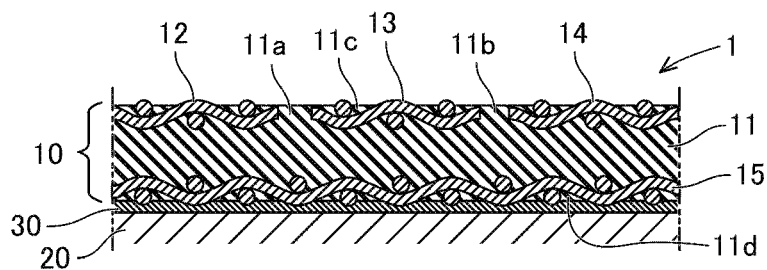
FIG. 1 is a cross-sectional view of a transducer of a first example.

An electrostatic-type transducer (hereinafter, referred to as "transducer") includes, for example, a base material and an electrostatic sheet that is attached to the attachment surface of the base material. The base material is formed of an arbitrary member such as metal, resin or other materials.

In addition, the attachment surface of the base material may be formed in a three-dimensional shape such as a curved surface, a complex plane, a complex shape of plane and curved surface or the like, or the front surface of the base material may be formed in a singular plane shape. When the base material is formed of a material having flexibility, the electrostatic sheet can also be attached to the attachment surface of the base material. In addition, the transducer can also be utilized as the single electrostatic sheet without including the base material.

The electrostatic sheet can utilize changes in capacitance between electrodes to function as an actuator that generates vibration, sound or the like. In addition, the electrostatic sheet can utilize changes in capacitance between electrodes to function as a senor that detects a pressing force from outside and the like, and a sensor that detects contact or approach of a conductor having a potential.

When the electrostatic sheet functions as an actuator, a voltage is applied to the electrodes, and thereby an insulator deforms corresponding to a potential between the electrodes, and vibration is generated along with the deformation of the insulator. When the electrostatic sheet functions as a pressing force detection sensor, the capacitance between the electrodes changes due to the deformation of the insulator caused by input of a pressing force from outside, vibration, sound or the like, and the pressing force from outside or the like is detected by detecting the voltage corresponding to the capacitance between the electrodes. In addition, when the electrostatic sheet functions as a contact and approach sensor, the capacitance between the electrodes changes due to contact or approach of a conductor having a potential, and the contact or approach of the conductor is detected by detecting the voltage corresponding to the changed capacitance between the electrodes.

For example, the transducer can be applied to the surface of a mouse or a joystick which is a pointing device, the surface of a vehicle part, and the like. The vehicle part includes an armrest, a doorknob, a shift lever, a steering wheel, door trim, center trim, a center console, a ceiling and the like. In many cases, the base material is formed of a material not having flexibility such as metal, hard resin or the like. Then, the transducer can detect a state of a target or apply vibration or the like to the target.

In addition, the transducer may be disposed on an outer-layer side of the sheet seating surface. In this case, the transducer may be configured in a manner that the electrostatic sheet is attached to the base material that is formed of a material having flexibility such as a resin film or the like. In addition, the transducer may also be configured of a single electrostatic sheet without including the base material.

In addition, the electrostatic sheet of the transducer can also be a configuration having a heater function. In this case, the transducer can perform application of heat to the target in addition to the detection of the state of the target or the application of vibration or the like to the target.

2. First Example (2-1. Configuration of Transducer 1 of First Example)

The configuration of a transducer 1 of a first example is described with reference to FIG. 1. As shown in FIG. 1, the transducer 1 at least includes an electrostatic sheet 10. In the first example, the transducer 1 includes, for example, a base material 20 and a base material side fusion sheet 30, but the transducer 1 may also be a configuration not including the base material 20 and the base material side fusion sheet 30. The base material 20 is formed of an arbitrary material such as metal, resin or the like.

The electrostatic sheet 10 is capable of elastically deforming as a whole. The electrostatic sheet 10 is attached to the attachment surface of the base material 20. Besides, even when the attachment surface of the base material 20 is a three-dimensional curved surface, the electrostatic sheet 10 can also be attached along the curved attachment surface of the base material 20. In particular, the electrostatic sheet 10 is attached to the attachment surface of the base material 20 while being extended in the surface direction, and thereby generation of wrinkles on the electrostatic sheet 10 can be suppressed.

The electrostatic sheet 10 at least includes an insulator sheet 11, a plurality of first electrode sheets 12, 13 and 14, and one second electrode sheet 15. The insulator sheet 11 is formed of an elastomer. Accordingly, the insulator sheet 11 is elastically deformable. The insulator sheet 11 is formed of a thermoplastic elastomer for example. The insulator sheet 11 may be formed of the thermoplastic elastomer, or may be formed of the elastomer obtained by cross-linking the thermoplastic elastomer serving as a raw material by heating.

Here, the insulator sheet 11 can select one or more elastomers from styrene-based elastomer, olefin-based elastomer, vinyl chloride-based elastomer, urethane-based elastomer, ester-based elastomer, amide-based elastomer and the like. For example, the styrene-based elastomer includes SBS, SEBS, SEPS and the like. The olefin-based elastomer includes copolymer of ethylene and α-olefin (ethylene-octene copolymer) in addition to EEA, EMA, EMMA, and the like.

The insulator sheet 11 may contain rubber and resin other than the thermoplastic elastomer. For example, when rubber such as ethylene-propylene rubber (EPM, EPDM) or the like is contained, flexibility of the insulator sheet 11 is improved. From the viewpoint of improving the flexibility of the insulator sheet 11, the insulator sheet may contain flexibility-imparting components such as a plasticizer and the like.

The first electrode sheets 12, 13, and 14 are arranged on the front surface (the upper surface of FIG. 1) side of the insulator sheet 11. In other words, the first electrode sheets 12, 13, and 14 are arranged with a distance from each other in the surface direction of the insulator sheet 11 on the front surface side of the insulator sheet 11. Each portion of the first electrode sheets 12, 13, and 14 independently functions as a detection region of the sensor or an operation region of the actuator.

In addition, the first electrode sheets 12, 13, and 14 have electrical conductivity, flexibility and elasticity toward the surface direction. For example, the first electrode sheets 12, 13, and 14 are formed of an electrically conductive fabric, an electrically conductive elastomer, a metal sheet having a through hole, or the like. In addition, when the first electrode sheets 12, 13, and 14 are materials having flexibility and elasticity, both a sheet having a through hole and a sheet having no through hole can be applied. When the first electrode sheets 12, 13, and 14 are materials not having flexibility and elasticity, the first electrode sheets 12, 13, and 14 can have the properties by having a through hole. In the first example, as the first electrode sheets 12, 13, and 14, for example, electrically conductive fabrics are used.

The electrically conductive fabric is a woven fabric or non-woven fabric formed of electrically conductive fibers. Here, the electrically conductive fiber is formed by coating the surface of a fiber having flexibility with electrically conductive materials. The electrically conductive fiber is formed, for example, by plating copper, nickel or the like on the surface of a resin fiber such as polyethylene or the like.

Furthermore, each of the first electrode sheets 12, 13, and 14 is adhered to the insulator sheet 11 by fusion (thermal fusion) of the insulator sheet 11. In other words, a part of the front surface side of the insulator sheet 11 functions as a fusion material for adhesion to each of the first electrode sheets 12, 13, and 14. Accordingly, the first electrode sheets 12, 13, and 14 and the insulator sheet 11 are adhered without using volatile adhesives or organic solvents.

Here, at least a part of each of the first electrode sheets 12, 13, and 14 is embedded in the insulator sheet 11. Accordingly, the insulator sheet 11 includes inter-electrode insulating layers 11a and 11b that are configured by a part of the front surface side of the insulator sheet 11 between the adjacent first electrode sheets 12, 13, and 14 in the surface direction of the insulator sheet 11. The inter-electrode insulating layer 11a is located between the first electrode sheets 12 and 13, and the inter-electrode insulating layer 11b is located between the first electrode sheets 13 and 14.

Accordingly, at least a part of the peripheral surface of each of the first electrode sheets 12, 13, and 14 is adhered to the inter-electrode insulating layers 11a and 11b by fusion of the inter-electrode insulating layers 11a and 11b. As a result, the insulator sheet 11 and each of the first electrode sheets 12, 13, and 14 are more firmly integrated. Furthermore, even when the first electrode sheets 12, 13, and 14 are disposed with a distance, unevenness are unlikely to generate on the front surface side of the electrostatic sheet 10. As a result, design property on the front surface side of the transducer 1 is excellent.

In addition, when the first electrode sheets 12, 13, and 14 have a through hole, a part of the front surface side of the insulator sheet 11 can also enter the through hole. In this case, the first electrode sheets 12, 13, and 14 are adhered by the part of the insulator sheet 11 entering the through hole. Accordingly, the insulator sheet 11 and each of the first electrode sheets 12, 13, and 14 are more firmly integrated.

In addition, at least a part of each of the first electrode sheets 12, 13, and 14 can be made into a state of being further deeply embedded in the insulator sheet 11. For example, when the front surfaces of the first electrode sheets 12, 13, and 14 are formed into an uneven shape, the concave portion of the front surface is in a state of being further deeply embedded in the insulator sheet 11.

In this case, the insulator sheet 11 includes, on the front surface side of the first electrode sheets 12, 13, and 14, a first coating layer 11c that is configured by a part of the front surface side of the insulator sheet 11. Accordingly, at least a part of the front surface of each of the first electrode sheets 12, 13, and 14 is adhered to the first coating layer 11c by fusion of the first coating layer 11c. As a result, the insulator sheet 11 and each of the first electrode sheets 12, 13, and 14 are more firmly integrated.

One second electrode sheet 15 is disposed on the back surface (the lower surface of FIG. 1) side of the insulator sheet 11. The second electrode sheet 15 faces all of the first electrode sheets 12, 13, and 14. In other words, the second electrode sheet 15 includes portions facing the first electrode sheets 12, 13, and 14 and portions facing each region between the adjacent first electrode sheets 12, 13, and 14 in the surface direction, and all the portions are formed integrally.

In addition, similar to the first electrode sheets 12, 13, and 14, the second electrode sheet 15 has electrical conductivity, flexibility, and elasticity toward the surface direction. The second electrode sheet 15 is formed of the same material as the first electrode sheets 12, 13, and 14.

Furthermore, the second electrode sheet 15 is adhered to the insulator sheet 11 by fusion (thermal fusion) of the insulator sheet 11. In other words, a part of the back surface side of the insulator sheet 11 functions as a fusion material for adhesion to the second electrode sheet 15. Accordingly, the second electrode sheet 15 and the insulator sheet 11 are adhered without using volatile adhesives or organic solvents.

In addition, when the second electrode sheet 15 has a through hole, a part of the back surface side of the insulator sheet 11 can enter the through hole. In this case, the second electrode sheet 15 is adhered by the part of the insulator sheet 11 entering the through hole. Accordingly, the insulator sheet 11 and the second electrode sheet 15 are more firmly integrated.

In addition, at least a part of the second electrode sheet 15 can be made into a state of being further deeply embedded in the insulator sheet 11. For example, when the back surface of the second electrode sheet 15 is formed into an uneven shape, the concave portion of the back surface is in a state of being further deeply embedded in the insulator sheet 11.

In this case, the insulator sheet 11 includes, on the back surface side of the second electrode sheet 15, a second coating layer 11d that is configured by a part of the back surface side of the insulator sheet 11. Accordingly, at least a part of the back surface of the second electrode sheet 15 is adhered to the second coating layer 11d by fusion of the second coating layer 11d. As a result, the insulator sheet 11 and the second electrode sheet 15 are more firmly integrated.

The base material side fusion sheet 30 is formed of the same material as the insulator sheet 11. The base material side fusion sheet 30 is adhered to the attachment surface of the base material 20 and is adhered to the back surface of the second electrode sheet 15 by fusion (thermal fusion) of the base material side fusion sheet 30.

(2-2. Manufacturing Method of Transducer 1 of First Example)

Figure 2:
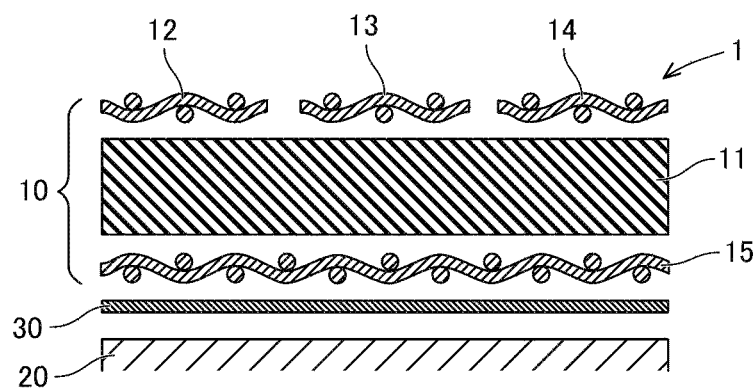
FIG. 2 is a diagram showing a manufacturing method of the transducer of the first example.

A manufacturing method of the transducer 1 of the first example is described with reference to FIG. 2. As shown in FIG. 2, the first electrode sheets 12, 13, and 14 are arranged on the front surface side of the insulator sheet 11, and the second electrode sheet 15 is disposed on the back surface side of the insulator sheet 11 (a preparation process). In this way, a laminate is prepared.

Subsequently, heating and pressing are performed in a lamination direction on the laminate (a first heating and pressing process). After that, the front surface of the insulator sheet 11 is softened, and the first electrode sheets 12, 13, and 14 are embedded from the front surface of the insulator sheet 11. Then, the front surface of the insulator sheet 11 functions as a fusion material, and the first electrode sheets 12, 13, and 14 are adhered to the insulator sheet 11. Furthermore, the back surface of the insulator sheet 11 is softened, and the second electrode sheet 15 is embedded from the back surface of the insulator sheet 11. Then, the back surface of the insulator sheet 11 functions as a fusion material, and the second electrode sheet 15 is adhered to the insulator sheet 11.

Subsequently, in a state that the front surface of the base material side fusion sheet 30 is heated and softened, the back surface side of the second electrode sheet 15 in a state of being integrated in the first heating and pressing process is pressed to the front surface of the base material side fusion sheet 30 (a second heating and pressing process). After that, the back surface side of the second electrode sheet 15 is adhered to the base material side fusion sheet 30 by fusion of the base material side fusion sheet 30.

Subsequently, in a state that the back surface of the base material side fusion sheet 30 is heated and softened, the attachment surface of the base material 20 is pressed to the back surface of the base material side fusion sheet 30 (a third heating and pressing process). After that, the attachment surface of the base material 20 is adhered to the base material side fusion sheet 30 by the fusion of the base material side fusion sheet 30. In this way, the transducer 1 is manufactured.

Here, the raw material of the insulator sheet 11 may not contain a cross-linking agent. In this case, by the heating in the first heating and pressing process, the cross-linking of the insulator sheet 11 can also be performed while the adhesion using the fusion of the insulator sheet 11 is performed. After the first heating and pressing process, the insulator sheet 11 is formed by the cross-linked elastomer.

In addition, when the material of the insulator sheet 11 contains a cross-linking agent, additional heating for cross-linking can also be performed after the first heating and pressing process (a cross-linking process). In this case, the cross-linking of the insulator sheet 11 can also be performed by the additional heating after the adhesion using the fusion of the insulator sheet 11. In this case, after the cross-linking process for performing the additional heating, the insulator sheet 11 is formed by the cross-linked elastomer.

In addition, in the first heating and pressing process, an adhesion process of the first electrode sheets 12, 13, and 14 and the insulator sheet 11 and an adhesion process of the second electrode sheet 15 and the insulator sheet 11 may be performed separately. In addition, the base material side fusion sheet 30 may be adhered to the base material 20 before being adhered to the second electrode sheet 15 in a state of being integrated in the first heating and pressing process. In addition, when the base material 20 is not present, the base material side fusion sheet 30 may not be required either.

(2-3. Effect of Transducer 1 of First Example)

The transducer 1 of the first example includes the plurality of first electrode sheets 12, 13, and 14 and one second electrode sheet 15. Accordingly, the portion functioning as the transducer 1 is present in a plurality of places, but only one second electrode sheet 15 is present. In other words, compared with a case in which the first electrode sheets 12, 13, and 14 and the second electrode sheet 15 are arranged with the same number, the number of the second electrode sheet 15 decreases and thus the parts count decreases as a whole. Then, the number of wirings connected to the second electrode sheet 15 can be reduced. Due to reduction in the number of wirings, the design flexibility is improved.

Then, since one of the electrode pair constituting the capacitance is configured by one second electrode sheet 15, a stable reference potential can be utilized when the reference potential is utilized. As a result, the detection precision as a sensor or the operation precision as an actuator can be improved.

Furthermore, the first electrode sheets 12, 13, and 14 and the insulator sheet 11 are adhered by the fusion of the insulator sheet 11. The second electrode sheet 15 and the insulator sheet 11 are also adhered by the fusion of the insulator sheet 11. Accordingly, in the transducer 1, the first electrode sheets 12, 13, and 14 and the second electrode sheet 15 can be adhered to the insulator sheet 11 without using volatile adhesives or organic solvents. In this way, by not using volatile adhesives or organic solvents, it is effective as an environmental problem countermeasure, and it is unnecessary to consider the effect on capacitance.

In addition, by heating and pressing, the first electrode sheets 12, 13, and 14 are adhered to the insulator sheet 11 by the fusion of the insulator sheet 11. In addition, by heating and pressing, the second electrode sheet 15 is adhered to the insulator sheet 11 by the fusion of the insulator sheet 11. Accordingly, adhesive application is unnecessary, and the transducer 1 can be easily manufactured. Accordingly, manufacturing cost can be reduced.

In addition, when the insulator sheet 11 is cross-linked when or after the insulator sheet 11 is adhered to the first electrode sheets 12, 13, and 14, the insulator sheet 11 and the first electrode sheets 12, 13, and 14 are more firmly integrated. The same applies to the second electrode sheet 15.

3. Transducer 2 of Second Example

Figure 3:
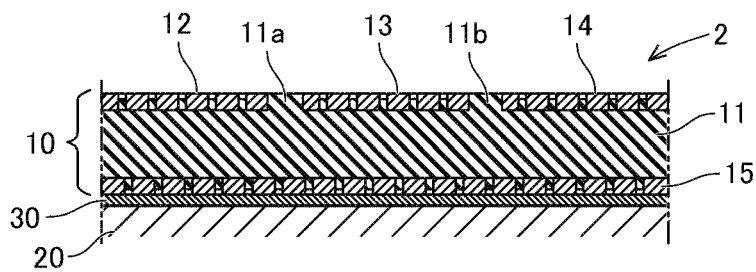
FIG. 3 is a cross-sectional view of a transducer of a second example.

The configuration of a transducer 2 of a second example is described with reference to FIG. 3. The transducer 2 of the second example is different from the transducer 1 of the first example in terms of the first electrode sheets 12, 13, and 14 and the second electrode sheet 15. In the second example, the first electrode sheets 12, 13, and 14 are formed of an electrically conductive elastomer for example. The electrically conductive elastomer refers to an elastomer containing electrically conductive fillers in the elastomer.

Here, the elastomer used in the first electrode sheets 12, 13, and 14 is formed of a material having the same main component as the main component in the insulator sheet 11. That is, the first electrode sheets 12, 13, and 14 can select one or more elastomers from styrene-based elastomer, olefin-based elastomer, vinyl chloride-based elastomer, urethane-based elastomer, ester-based elastomer, amide-based elastomer and the like. For example, the styrene-based elastomer includes SBS, SEBS, SEPS and the like. The olefin-based elastomer includes copolymer of ethylene and α-olefin (ethylene-octene copolymer) in addition to EEA, EMA, EMMA, and the like.

However, the first electrode sheets 12, 13, and 14 have a higher softening point than that of the insulator sheet 11. The reason is to make it possible that the insulator sheet 11 is softened prior to the first electrode sheets 12, 13, and 14 when being adhered to the first electrode sheets 12, 13, and 14 by the fusion of the insulator sheet 11.

In addition, the first electrode sheets 12, 13, and 14 may have a through hole or may have no through hole. In FIG.

3, a case in which the first electrode sheets 12, 13, and 14 have a though hole is used as an example. When the first electrode sheets 12, 13, and 14 have a though hole, the insulator sheet 11 and the first electrode sheets 12, 13, and 14 are firmly integrated.

The second electrode sheet 15 is formed of the same material as that of the first electrode sheets 12, 13, and 14. In other words, the second electrode sheet 15 is formed of an electrically conductive elastomer and has a through hole.

The transducer 2 of the second example is manufactured in the same manner as the transducer 1 of the first example. Here, in the first heating and pressing process, the heating and the pressing are performed in a state that the first electrode sheets 12, 13, and 14 are arranged on the front surface side of the insulator sheet 11. At this time, the softening point of the insulator sheet 11 is lower, and thus the insulator sheet 11 is softened first. Accordingly, the front surface of the insulator sheet 11 is softened, and the first electrode sheets 12, 13, and 14 are embedded from the front surface of the insulator sheet 11.

At this time, the outer surface of the first electrode sheets 12, 13, and 14 is slightly softened, and thereby the elastomer of the first electrode sheets 12, 13, and 14 and the elastomer of the insulator sheet 11 are integrally coupled. As a result, the elastomer of the first electrode sheets 12, 13, and 14 and the elastomer of the insulator sheet 11 are more firmly coupled.

In addition, the second electrode sheet 15 is the same as the first electrode sheets 12, 13, and 14. In other words, the second electrode sheet 15 is adhered in a state of being embedded in the back surface side of the insulator sheet 11 by fusion of a part of the back surface side of the insulator sheet 11. Furthermore, the outer surface of the second electrode sheet 15 is slightly softened, and thereby the elastomer of the second electrode sheet 15 and the elastomer of the insulator sheet 11 are integrally coupled.

In addition, the material of the insulator sheet 11 and the material of the first electrode sheets 12, 13, and 14 may not contain a cross-linking agent. In this case, the insulator sheet 11 is formed of a cross-linked elastomer, and thereby the insulator sheet 11 and the first electrode sheets 12, 13, and 14 are more firmly integrated. Furthermore, by the material of the first electrode sheets 12, 13, and 14 containing a cross-linking agent, the elastomer of the first electrode sheets 12, 13, and 14 is cross-linked between the insulator sheet 11 and the first electrode sheets 12, 13, and 14. In other words, by the cross-linking across the insulator sheet 11 and the first electrode sheets 12, 13, and 14, the insulator sheet 11 and the first electrode sheets 12, 13, and 14 are more firmly integrated.

In addition, similar to the first electrode sheets 12, 13, and 14, the second electrode sheet 15 may contain a cross-linking agent in the raw material. In this case, by the cross-linking across the insulator sheet 11 and the second electrode sheet 15, the insulator sheet 11 and the second electrode sheet 15 are more firmly integrated. Besides, as for the heating for the cross-link, the heating in the first heating and pressing process may be utilized, or additional heating may be performed after the first heating and pressing process.

4. Transducer 3 of Third Example (4-1. Configuration of Transducer 3 of Third Example)

Figure 4:
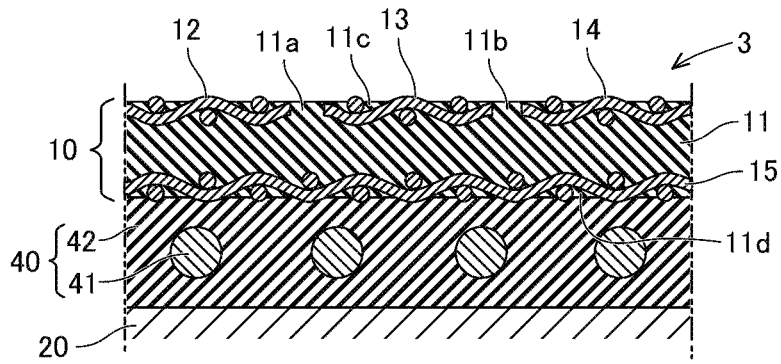
FIG. 4 is a cross-sectional view of a transducer of a third example.

The configuration of a transducer 3 of a third example is described with reference to FIG. 4. As shown in FIG. 4, the transducer 3 includes an electrostatic sheet 10, a base material 20, and a heater sheet 40 disposed between the back surface of the electrostatic sheet 10 and the front surface of the base material 20. In other words, the transducer 3 has a heater function in addition to the sensor function or the actuator function.

Here, the electrostatic sheet 10 may be the electrostatic sheet 10 in the transducer 1 of the first example, or may be the electrostatic sheet 10 in the transducer 2 of the second example. However, the insulator sheet 11 constituting the electrostatic sheet 10 may be formed of the following material in order that heat of the heater sheet 40 can be transmitted to the front surface of the electrostatic sheet 10 and that heat resistance property is ensured.

The thermal conductivity of the insulator sheet 11 is 0.3 W/m·K or more. The preferred thermal conductivity is 0.4 W/m·K or more, even 0.5 W/m·K or more. Desirably, the insulator sheet 11 has an insulating inorganic filler with a relatively large thermal conductivity. The preferred thermal conductivity of the inorganic filler (thermally conductive filler) used for increasing the thermal conductivity of the insulator sheet 11 is 5 W/m·K or more, preferably 10 W/m·K or more, more preferably 20 W/m·K or more. The inorganic filler with a relatively large thermal conductivity includes a metal filler, for example, magnesium oxide, aluminum oxide, aluminum nitride or the like. In addition to the metal filler, boron nitride, silicon carbide or the like can also be used as the inorganic filler with a relatively large thermal conductivity.

In addition, from the viewpoint of providing flame-retardant property to the insulator sheet 11, the insulator sheet 11 preferably has a flame-retardant and insulating inorganic filler. The flame-retardant filler includes a hydroxide filler, for example, magnesium hydroxide, aluminum hydroxide or the like. In addition to the hydroxide filler, boron nitride or the like can also be used as the flame-retardant filler. In addition, the flame-retardant filler can also be used as the inorganic filler (thermally conductive filler) used for increasing the thermal conductivity of the insulator sheet 11.

In addition, from the view point of ensuring the insulation property of the insulator sheet 11, the volume resistivity of the insulator sheet 11 is $1 \times 10^{12}$ Ω·cm or more. The preferred volume resistivity is $1 \times 10^{13}$ Ω·cm or more.

The heater sheet 40 is disposed on the back surface side of the electrostatic sheet 10, that is, on the back surface side of the second electrode sheet 15. The heater sheet 40 includes a heater wire 41, and a heater insulating layer 42 coating the heater wire 41. The heater wire 41 is a metal alloy material, for example, nickel chrome, iron chrome or the like. As for the heater wire 41, for example, a wire material is formed in a reciprocating manner or is wound spirally to have a sheet shape.

The heater insulating layer 42 is disposed to enclose the heater wire 41 and not to expose the heater wire 41. The heater insulating layer 42 may be formed of the same material as that of the insulator sheet 11. Furthermore, a part of the front surface side of the heater insulating layer 42 is adhered to the back surface of the second electrode sheet 15 by fusion (thermal fusion). Furthermore, the front surface side of the heater insulating layer 42 is also adhered to the exposed back surface of the insulator sheet 11 by fusion. In addition, a part of the back surface side of the heater insulating layer 42 is adhered to the attachment surface of the base material 20 by fusion (thermal fusion).

(4-2. Manufacturing Method of Transducer 3 of Third Example)

Figure 5:
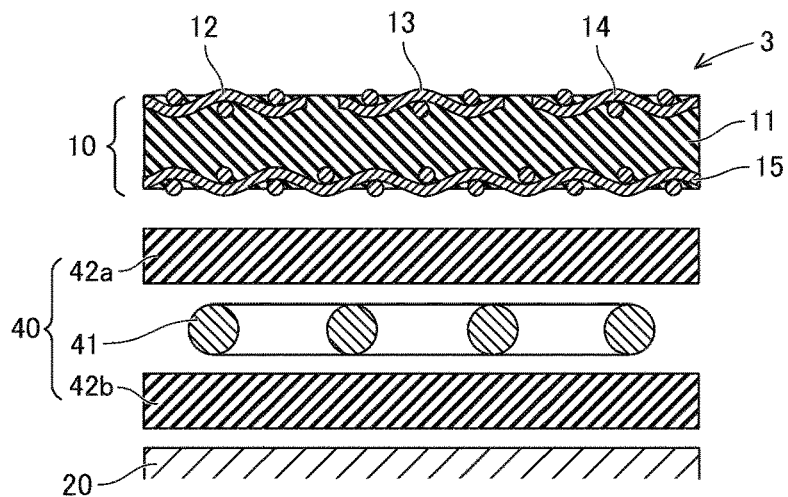
FIG. 5 is a diagram showing a manufacturing method of the transducer of the third example.

A manufacturing method of the transducer 3 of the third example is described with reference to FIG. 5. A heater sheet laminate in which a first raw material 42a of the heater insulating layer 42, the heater wire 41, and a second raw material 42b of the heater insulating layer 42 are laminated in order is prepared (a heater sheet preparation process).

Subsequently, the heater sheet laminate is heated and pressed (a heater sheet heating and pressing process). After that, each of the first raw material 42a and the second raw material 42b is softened to function as a fusion material and is adhered to the heater wire 41. Furthermore, the first raw material 42a and the second raw material 42b are adhered to each other to be integrated, and thereby the heater insulating layer 42 is formed. In this way, the heater sheet 40 is formed.

Subsequently, the electrostatic sheet 10 and the heater sheet 40 are prepared (a preparation process). The front surface of the heater sheet 40 is heated (a heater sheet heating process). Then, the electrostatic sheet 10 and the heater sheet 40 are pressed in a manner that the back surface side of the electrostatic sheet 10 is in contact with the front surface side of the heater sheet 40 (a pressing process). After that, the front surface side of the heater insulating layer 42 is softened to function as a fusion material, and the second electrode sheet 15 is adhered to the front surface side of the heater insulating layer 42. At the same time, the front surface side of the heater insulating layer 42 is also adhered to the exposed surface on the back surface side of the insulator sheet 11 of the electrostatic sheet 10.

Subsequently, in a state that the back surface of the heater sheet 40 is heated and softened, the attachment surface of the base material 20 is pressed to the back surface of the heater sheet 40 (a heating and pressing process). After that, the attachment surface of the base material 20 is adhered to the heater insulating layer 42 by fusion of the heater insulating layer 42. In this way, the transducer 3 is manufactured.

(4-3. Effect of Transducer 3 of Third Example)

The transducer 3 has the heater function and thus can perform application of heat to the target in addition to the detection of the state of the target or the application of vibration or the like to the target. In particular, by setting the thermal conductivity of the insulator sheet 11 and the heater insulating layer 42 as described above, the heat of the heater wire 41 can be transmitted to the front surface of the electrostatic sheet 10. In addition, the insulator sheet 11 and the heater insulating layer 42 have the flame-retardant fillers, and thereby a heat resistance effect can be improved.

In addition, along with supply of electric power to the heater wire 41, the heater wire 41 may become a noise source. However, the second electrode sheet 15 is not separated as the first electrode sheets 12, 13, and 14, and thus performs a shielding function to the heater wire 41 in the entire range. Accordingly, even if noise is generated due to the electric power supplied to the heater wire 41, the second electrode sheet 15 can exhibit a shielding function. As a result, the transducer 3 can achieve excellent detection precision as a sensor or excellent operation precision as an actuator great.

5. Transducer 100 of Fourth Example

Figure 6:
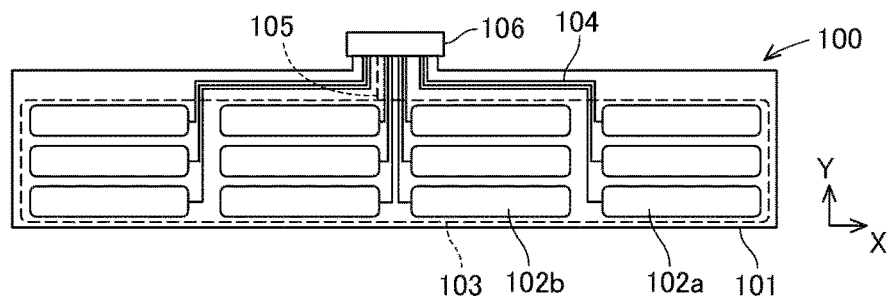
FIG. 6 is a plan view of a transducer of a fourth example.

A transducer 100 of a fourth example is described with reference to FIG. 6. FIG. 6 shows a diagram viewed from the front surface side of the transducer 100. The transducer 100 is formed into an elongated shape, the longitudinal direction (first direction) in the front surface is set as an X-direction, and the latitudinal direction (second direction) in the front surface is set as a Y-direction. The X-direction and the Y-direction are directions perpendicular to each other.

The transducer 100 is attached to an elongated target. For example, any one of an armrest, a doorknob, a shift lever, a steering wheel, door trim, center trim, a center console and the like is formed into an elongated shape and a three-dimensional curved surface shape. Accordingly, the longitudinal direction of the transducer 100 is made coincident with the longitudinal direction of the target, and the transducer 100 is attached to the target while being made to deform along the front surface of the target.

Here, the cross-sectional shape of the transducer 100 can be applied in the configurations of the transducers 1, 2, and 3 from the first example to the third example. However, in FIG. 6, arrangements on the plane of the insulator sheet 101, the plurality of first electrode sheets 102a and 102b, and the second electrode sheet 103 are shown, and arrangements on the plane of the base material 20, the base material side fusion sheet 30, and the heater sheet 40 are not shown.

In addition to the insulator sheet 101, the plurality of first electrode sheets 102a and 102b, and the second electrode sheet 103, the transducer 100 includes a first wiring 104, a second wiring 105, and one connector 106.

The insulator sheet 101 is formed into an elongated rectangular shape in which the X-direction is set as a longitudinal direction. The plurality of first electrode sheets 102a and 102b is formed into a substantially rectangular shape. All the first electrode sheets 102a and 102b are formed into the same shape. The plurality of first electrode sheets 102a and 102b is disposed on the front surface side of the insulator sheet 101 so that the longitudinal direction of the first electrode sheets 102a and 102b is coincident with the longitudinal direction of the insulator sheet 101.

Furthermore, a plurality of first electrode sheets 102a and 102b is arranged in the X-direction and in the Y-direction. In the transducer 100, four rows of the first electrode sheets 102a and 102b are arranged in the X-direction, and three rows of the first electrode sheets 102a and 102b are arranged in the Y-direction. Accordingly, the transducer 100 has detection portions in a plurality of places in the X-direction and has detection portions in a plurality of places in the Y-direction. However, the number of rows in the X-direction and the Y-direction can be appropriately changed.

The second electrode sheet 103 is formed into an elongated rectangular shape slightly smaller than the insulator sheet 101. The second electrode sheet 103 is formed in a range account for a large portion of the insulator sheet 101 on the back surface side of the insulator sheet 101.

A plurality of first wirings 104 is disposed on the front surface side of the insulator sheet 101, and is electrically connected to each of the plurality of first electrode sheets 102a and 102b. The plurality of first wirings 104 is aggregated in one place in the outer periphery of the insulator sheet 101. The second wiring 105 is disposed on the back surface side of the insulator sheet 101, and is electrically connected to the second electrode sheet 103. The second wiring 105 is arranged in the place where the plurality of first wirings 104 is aggregated. In other words, the plurality of first wirings 104 and at least one second wiring 105 are aggregated in one place.

The connector 106 is disposed at the outer peripheral edge of the insulator sheet 101, and is electrically connected to the aggregated plurality of first wirings 104 and second wiring 105. Besides, the connector 106 is connected to another connector (not shown).

By arranging one second electrode sheet 103, the number of the second wiring 105 and the number of pins of the connector 106 can be decreased. Accordingly, the transducer 100 can achieve improvement in arrangement flexibility and cost reduction.

6. Transducer 200 of Fifth Example

Figure 7:
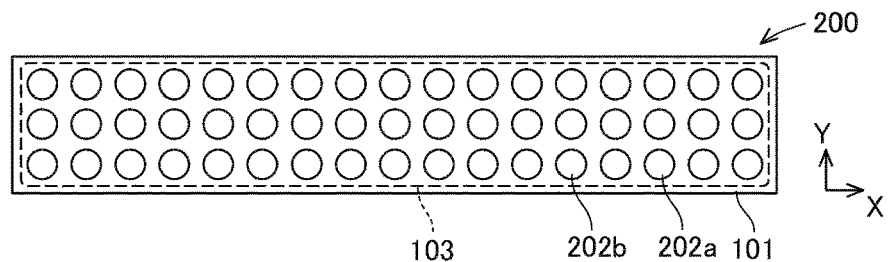
FIG. 7 is a plan view of a transducer of a fifth example.

A transducer 200 of a fifth example is described with reference to FIG. 7. The transducer 200 includes an insulator sheet 101, a plurality of first electrode sheets 202a and 202b, and a second electrode sheet 103. In the transducer 200 of the fifth example, configurations that are substantially the same as that of the transducer 100 of the fourth example are denoted by the same reference numeral and the description is omitted. The same also applies to the following example.

The first electrode sheets 202a and 202b in the transducer 200 are formed in a non-elongated shape, for example, circle, regular polygon or the like. All the first electrode sheets 202a and 202b are formed into the same shape. A plurality of first electrode sheets 202a and 202b is arranged in the X-direction and in the Y-direction. In this way, in the transducer 200, high resolution detection or operation can be implemented.

7. Transducer 300 of Sixth Example

Figure 8:
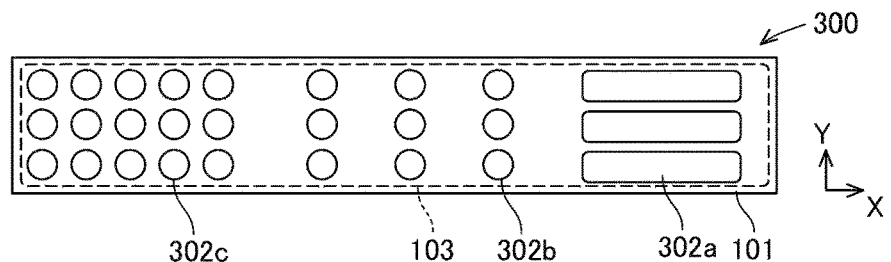
FIG. 8 is a plan view of a transducer of a sixth example.

A transducer 300 of a sixth example is described with reference to FIG. 8. The transducer 300 includes an insulator sheet 101, a plurality of first electrode sheets 302a, 302b, and 302c, and a second electrode sheet 103.

In the transducer 300, the first electrode sheets 302a, 302b, and 302c are formed into different shapes. The first electrode sheet 302a is formed into an elongated shape, and the first electrode sheets 302b and 302c are formed into a non-elongated shape smaller than the first electrode sheet 302a. The first electrode sheets 302a are arranged on one end side in the X-direction of the insulator sheet 101. The first electrode sheets 302b are arranged in low density at the center in the X-direction of the insulator sheet 101. The first electrode sheets 302c are arranged in high density on the other end side in the X-direction of the insulator sheet 101.

In a region of the first electrode sheets 302a arranged on one end side in the X-direction, the detection or operation can be implemented with low resolution and high sensitivity. In addition, in a region of the first electrode sheets 302b arranged at the center in the X-direction, the detection or operation can be implemented with low resolution and low sensitivity. In a region of the first electrode sheets 302c arranged on the other end side in the X-direction, the detection or operation can be implemented with high resolution and high sensitivity. In other words, the resolution and sensitivity can be appropriately adjusted according to the size and electrode density of each of the first electrode sheets 302a, 302b, and 302c.

8. Transducer 400 of Seventh Example

Figure 9:
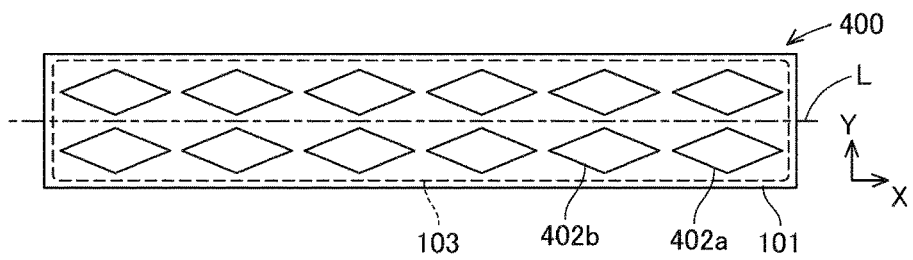
FIG. 9 is a plan view of a transducer of a seventh example.

A transducer 400 of a seventh example is described with reference to FIG. 9. The transducer 400 includes an insulator sheet 101, a plurality of first electrode sheets 402a and 402b, and a second electrode sheet 103.

In the transducer 400, the first electrode sheets 402a and 402b are formed into a diamond shape. All the first electrode sheets 402a and 402b are formed into the same shape. A plurality of first electrode sheets 402a and 402b is arranged in the X-direction and two of first electrode sheets 402a and 402b are arranged in the Y-direction. The first electrode sheets 402a and 402b are disposed line-symmetrically with respect to a center line L passing through the latitudinal center of the insulator sheet 101. In this way, in the transducer 400, high resolution detection or operation can be implemented.

9. Transducer 500 of Eighth Example

Figure 10:
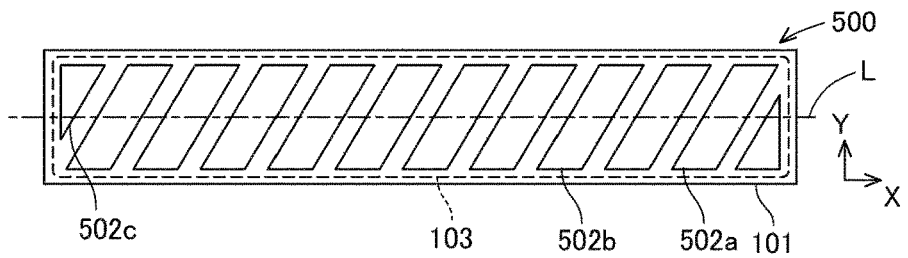
FIG. 10 is a plan view of a transducer of an eighth example.

A transducer 500 of an eighth example is described with reference to FIG. 10. The transducer 500 includes an insulator sheet 101, a plurality of first electrode sheets 502a, 502b, and 502c, and a second electrode sheet 103.

The first electrode sheets 502a and 502b in the transducer 500 are formed into a parallelogram. A distance of one pair of opposite sides of the parallelogram is slightly shorter than the width in the latitudinal direction of the insulator sheet 101. A distance of the other pair of opposite sides of the parallelogram is shorter than the distance of the one pair of opposite sides. A plurality of first electrode sheets 502a and 502b are arranged in the X-direction so that the one pair of opposite sides of the parallelogram are parallel to the latitudinal edge of the insulator sheet 101. However, at both ends in the longitudinal direction of the insulator sheet 101, the first electrode sheet 502c is formed into a right triangle shape of the remaining area.

10. Transducer 600 of Ninth Example

Figure 11:
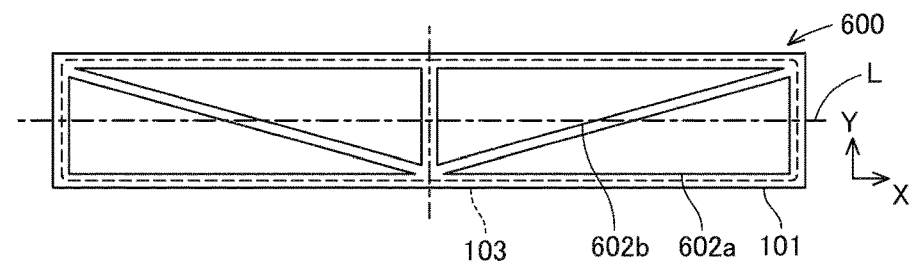
FIG. 11 is a plan view of a transducer of a ninth example.

A transducer 600 of a ninth example is described with reference to FIG. 11. The transducer 600 includes an insulator sheet 101, a plurality of first electrode sheets 602a and 602b, and a second electrode sheet 103.

In the transducer 600, the first electrode sheets 602a and 602b are formed into a right triangle shape. All the first electrode sheets 602a and 602b are formed into the same shape. The length of a short side that forms the right angle of the right triangle shape is slightly shorter than the width in the latitudinal direction of the insulator sheet 101. The short side of the right triangle shape is disposed parallel to the latitudinal direction of the insulator sheet 101.

Besides, in two adjacent first electrode sheets 602a and 602b, hypotenuses of the right triangle shapes face each other. In other words, the two adjacent first electrode sheets 602a and 602b are disposed point-symmetrically taking a point near the midpoints of the hypotenuses as a center.

In other words, one first electrode sheet 602a of the two adjacent first electrode sheets is disposed across the center line L passing through the latitudinal center of the insulator sheet 101. Furthermore, the other first electrode sheet 602b of the two adjacent first electrode sheets is disposed across the center line L passing through the latitudinal center of the insulator sheet 101. Then, the two adjacent first electrode sheets 602a and 602b are at least partially adjacent to each other in the longitudinal direction of the insulator sheet 101, and are at least partially adjacent to each other in the latitudinal direction of the insulator sheet 101.

11. Transducer 700 of Tenth Example

Figure 12:
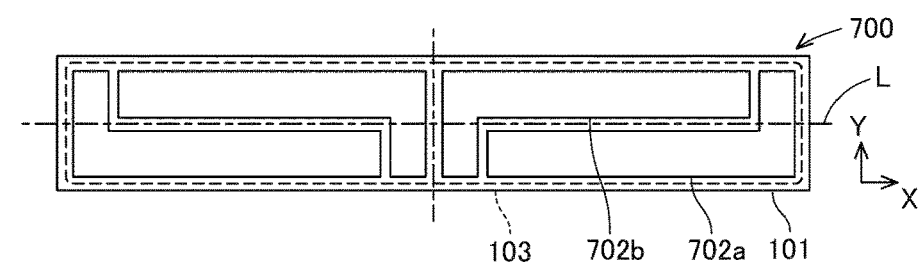
FIG. 12 is a plan view of a transducer of a tenth example.

A transducer 700 of a tenth example is described with reference to FIG. 12. The transducer 700 includes an insulator sheet 101, a plurality of first electrode sheets 702a and 702b, and a second electrode sheet 103.

In the transducer 700, the first electrode sheets 702a and 702b are formed into an L-shape. All the first electrode sheets 702a and 702b are formed into the same shape. The length of a short side of the L-shape is slightly shorter than the width in the latitudinal direction of the insulator sheet 101. The short side of the L shape is disposed parallel to the latitudinal direction of the insulator sheet 101.

Besides, the two adjacent first electrode sheets 702a and 702b are disposed point-symmetrically taking a point near the midpoints of long sides of the L-shapes as a center. In other words, the end portion of the long side of the L-shape of one first electrode sheet 702a faces the short side of the L-shape of the other first electrode sheet 702b in the X-direction. In addition, the short side of the L-shape of one first electrode sheet 702a faces the end portion of the long side of the L-shape of the other first electrode sheet 702b in the X-direction. The long side of the L-shape of one first electrode sheet 702a faces the long side of the L-shape of the other first electrode sheet 702b in the Y-direction.

In other words, one first electrode sheet 702a of the two adjacent first electrode sheets is disposed across the center line L passing through the latitudinal center of the insulator sheet 101. Furthermore, the other first electrode sheet 702b of the two adjacent first electrode sheets is disposed across the center line L passing through the latitudinal center of the insulator sheet 101. Besides, the two adjacent first electrode sheets 702a and 702b are at least partially adjacent to each other in the longitudinal direction of the insulator sheet 101, and are at least partially adjacent to each other in the latitudinal direction of the insulator sheet 101.

12. Transducer 800 of Eleventh Example

Figure 13:
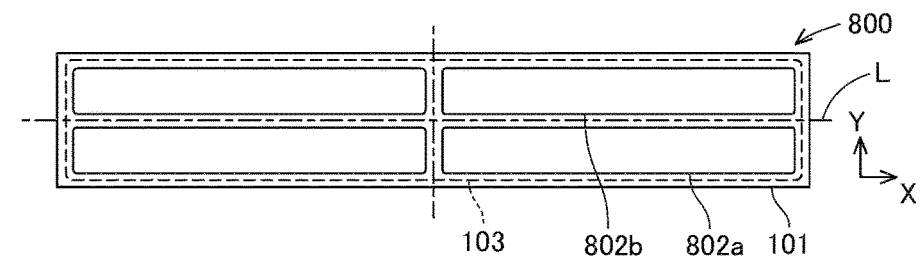
FIG. 13 is a plan view of a transducer of an eleventh example.

A transducer 800 of an eleventh example is described with reference to FIG. 13. The transducer 800 includes an insulator sheet 101, a plurality of first electrode sheets 802a and 802b, and a second electrode sheet 103.

The first electrode sheets 802a and 802b in the transducer 800 is formed into a rectangle shape. All the first electrode sheet 802a, 802b are formed into the same shape. A distance between short sides of the rectangle shape is slightly shorter than half of the width in the latitudinal direction of the insulator sheet 101. A distance between long sides of the rectangle shape is slightly shorter than half of the length in the longitudinal direction of the insulator sheet 101. The longitudinal direction of the first electrode sheets 802a and 802b is disposed to be coincident with the longitudinal direction of the insulator sheet 101.

Two first electrode sheets 802a and 802b are arranged in the X-direction and two in the Y-direction. The first electrode sheets 802a and 802b are disposed line-symmetrically with respect to the center line L passing through the latitudinal center of the insulator sheet 101.

13. Transducer 900 of Twelfth Example

Figure 14:
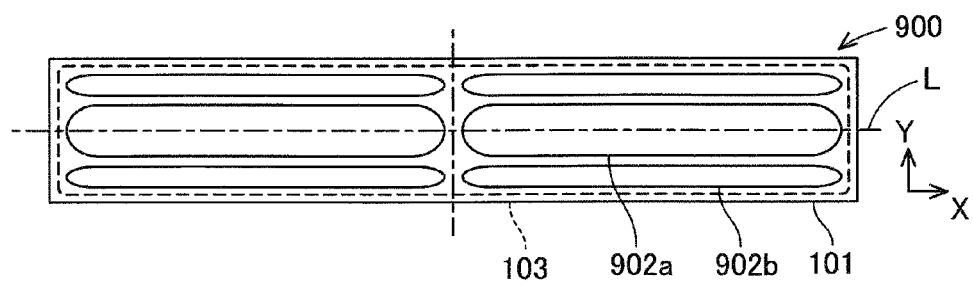
FIG. 14 is a plan view of a transducer of a twelfth example.

A transducer 900 of a twelfth example is described with reference to FIG. 14. The transducer 900 includes an insulator sheet 101, a plurality of first electrode sheets 902a and 902b, and a second electrode sheet 103.

In the transducer 300, the first electrode sheets 902a and 902b are formed into different shapes. The first electrode sheet 902a is formed into an elongated shape and is disposed along the center line L passing through the latitudinal center of the insulator sheet 101. The first electrode sheet 902b is disposed adjacent to the first electrode sheet 902a on both end sides in the latitudinal direction of the insulator sheet 101.

The electrostatic-type transducer of the disclosure includes: an insulator sheet formed of an elastomer; a plurality of first electrode sheets which is arranged on a front surface side of the insulator sheet, adhered to the insulator sheet by fusion of the insulator sheet, and arranged with a distance from each other in the surface direction of the insulator sheet; and one second electrode sheet which is disposed on a back surface side of the insulator sheet and adhered to the insulator sheet by fusion of the insulator sheet, and in which portions facing the plurality of first electrode sheets and portions facing each region between the adjacent first electrode sheets in the surface direction are formed integrally.

The electrostatic-type transducer of the disclosure is configured to include a plurality of first electrode sheets and one second electrode sheet. Accordingly, the portion functioning as the transducer is present in a plurality of places, but only one second electrode sheet is present. In other words, compared with a case in which the first electrode sheet and the second electrode sheet are arranged with the same number, the number of the second electrode sheet decreases, and thus the parts count decreases as a whole. Then, the number of wirings connected to the second electrode sheet can be reduced. Due to reduction in the number of wirings, the design flexibility is improved.

Then, since one of the electrode pair constituting the capacitance is configured by one second electrode sheet, a stable reference potential can be utilized when the reference potential is utilized. As a result, the detection precision as a sensor or the operation precision as an actuator can be improved.

Furthermore, as for the first electrode sheets and the insulator sheet, the first electrode sheets are adhered to the insulator sheet by the fusion of the insulator sheet. As for the second electrode sheet and the insulator sheet, the second electrode sheet is also adhered to the insulator sheet by the fusion of the insulator sheet. Accordingly, in the electrostatic-type transducer, the first electrode sheets and the second electrode sheet can be adhered to the insulator sheet without using volatile adhesives or organic solvents. In this way, by not using volatile adhesives or organic solvents, it is effective as an environmental problem countermeasure, and it is unnecessary to consider the effect on capacitance.

In addition, in the manufacturing method of electrostatic-type transducer of the disclosure, the plurality of first electrode sheets is arranged on the front surface side of the insulator sheet, and the plurality of first electrode sheets is adhered to the insulator sheet by the fusion of the insulator sheet by heating and pressing. By this manufacturing method, the above-described electrostatic-type transducer can be easily manufactured. Accordingly, manufacturing cost can be reduced.

What is claimed is:
1. An electrostatic-type transducer, comprising:
an insulator sheet formed of an elastomer;
a plurality of first electrode sheets which is arranged on a front surface side of the insulator sheet, adhered to the insulator sheet by fusion of the insulator sheet, and arranged with a distance from each other in a surface direction of the insulator sheet; and
one second electrode sheet which is disposed on a back surface side of the insulator sheet, adhered to the insulator sheet by fusion of the insulator sheet, and in which portions facing the plurality of first electrode sheets and portions facing each region between the adjacent first electrode sheets in the surface direction are formed integrally.

2. The electrostatic-type transducer according to claim 1,
wherein at least a part of each of the plurality of first electrode sheets is embedded in the insulator sheet;
the insulator sheet comprises inter-electrode insulating layers that are configured by a part of the insulator sheet between the adjacent first electrode sheets in the surface direction of the insulator sheet; and
at least a part of a peripheral surface of each of the plurality of first electrode sheets is adhered to the inter-electrode insulating layers by fusion of the inter-electrode insulating layers.

3. The electrostatic-type transducer according to claim 2,
wherein at least a part of each of the plurality of first electrode sheets is embedded in the insulator sheet;
the insulator sheet comprises a first coating layer that is configured by a part of the insulator sheet on a front surface side of the first electrode sheet; and
at least a part of the front surface of each of the plurality of first electrode sheets is adhered to the first coating layer by fusion of the first coating layer.

4. The electrostatic-type transducer according to claim 1, wherein the plurality of first electrode sheets is arranged in a first direction on the front surface of the insulator sheet.

5. The electrostatic-type transducer according to claim 4, wherein the plurality of first electrode sheets is further arranged in a second direction perpendicular to the first direction on the front surface of the insulator sheet.

6. The electrostatic-type transducer according to claim 1,
wherein the insulator sheet and the second electrode sheet are formed into an elongated shape;
one of two adjacent first electrode sheets is disposed across a center line passing through a latitudinal center of the insulator sheet, and
the other one of the two adjacent first electrode sheets is disposed across the center line passing through the latitudinal center of the insulator sheet; and
the two adjacent first electrode sheets are at least partially adjacent to each other in the longitudinal direction of the insulator sheet, and at least partially adjacent to each other in the latitudinal direction of the insulator sheet.

7. The electrostatic-type transducer according to claim 1, wherein at least two of the plurality of first electrode sheets are formed into the same shape.

8. The electrostatic-type transducer according to claim 1, wherein at least two of the plurality of first electrode sheet are formed into different shapes.

9. The electrostatic-type transducer according to claim 1, wherein the electrostatic-type transducer further comprises:
a plurality of first wirings that is electrically connected to each of the plurality of first electrode sheets,
at least one second wiring that is electrically connected to the one second electrode sheet, and
one connector that aggregates the plurality of first wirings and the at least one second wiring.

10. The electrostatic-type transducer according to claim 1, wherein the insulator sheet is formed of the cross-linked elastomer.

11. The electrostatic-type transducer according to claim 10,
wherein the first electrode sheet comprises:
an elastomer that consists of a material having the same main component as that of the insulator sheet and is cross-linked with the insulator sheet, and
an electrically conductive filler.

12. A manufacturing method of electrostatic-type transducer, which manufactures the electrostatic-type transducer according to claim 10, comprising:
arranging the plurality of first electrode sheets on the front surface side of the insulator sheet;
performing heating and pressing after the plurality of first electrode sheets is arranged, and thereby adhering the plurality of first electrode sheets to the insulator sheet by fusion of the insulator sheet; and
performing a cross-linking of the insulator sheet by the heating while the adhering using the fusion is performed.

13. A manufacturing method of electrostatic-type transducer, which manufactures the electrostatic-type transducer according to claim 10, comprising:
arranging the plurality of first electrode sheets on the front surface of the insulator sheet;
performing heating and pressing after the plurality of first electrode sheets is arranged, and thereby adhering the plurality of first electrode sheets to the insulator sheet by fusion of the insulator sheet; and
performing a cross-linking of the insulator sheet by additional heating after the adhering.

14. The electrostatic-type transducer according to claim 1, wherein the insulator sheet is formed of a styrene-based elastomer or an olefin-based elastomer.

15. The electrostatic-type transducer according to claim 14, wherein the first electrode sheet is formed of a styrene-based elastomer or an olefin-based elastomer, and has a softening point higher than that of the insulator sheet.

16. The electrostatic-type transducer according to claim 1, wherein the electrostatic-type transducer further comprises a heater sheet laminated on the back surface side of the second electrode sheet.

17. The electrostatic-type transducer according to claim 16, wherein the thermal conductivity of the insulator sheet is 0.3 W/m·K or more.

18. The electrostatic-type transducer according to claim 17, wherein the insulator sheet has a thermally conductive filler with a thermal conductivity of 5 W/m·K or more.

19. The electrostatic-type transducer according to claim 18, wherein the thermally conductive filler is an insulating metal filler.

20. The electrostatic-type transducer according to claim 16, wherein the insulator sheet has a flame-retardant filler.

21. The electrostatic-type transducer according to claim 20, wherein the flame-retardant filler is a hydroxide filler.

22. A manufacturing method of electrostatic-type transducer, which manufactures the electrostatic-type transducer according to claim 1, comprising:
arranging the plurality of first electrode sheets on the front surface side of the insulator sheet; and
adhering the plurality of first electrode sheets to the insulator sheet by fusion of the insulator sheet by heating and pressing.

* * * * *